June 11, 1963 A. R. HUTSON 3,093,758

PIEZOELECTRIC DEVICES UTILIZING CADMIUM SULFIDE

Filed April 13, 1960

INVENTOR
A. R. HUTSON
BY George S. Indig
ATTORNEY

United States Patent Office 3,093,758
Patented June 11, 1963

3,093,758
PIEZOELECTRIC DEVICES UTILIZING CADMIUM SULFIDE

Andrew R. Hutson, Plainfield, N.J., assignor to Bell Telephone Laboratories, Incorporated, New York, N.Y., a corporation of New York Filed Apr. 13, 1960, Ser. No. 22,015
3 Claims. (Cl. 310—8)

This invention relates to piezoelectric device elements utilizing cadmium sulfide as the active material and to devices including such elements.

It is unnecessary to discuss at any length the role played by piezoelectric devices in modern technology. Quartz filters and resonators have played an important role for decades. The literature abounds with references to other piezoelectric materials, E.D.T., A.D.P., etc., finding use in piezoelectric devices such as hydrophones, sonar devices, delay lines, transducers, and other ultrasonic generators and detectors. Probably quartz is the best known piezoelectric material. Its popularity, in large part, is due to its physical and chemical stability. It is generally unreactive with atmospheric components, is stable over long use and withstands relatively high physical strain. The organic materials, many of which were developed during World War II in expectation of a quartz shortage, although possessed of significantly larger coupling coefficients, dissolve in water, are chemically unstable and are otherwise unsuitable for many uses to which quartz is put.

For many uses, a need exists for a piezoelectric material having a higher coupling coefficient than quartz and otherwise evidencing the excellent physical and chemical properties of this material. In the past, it has been possible to meet some of these needs by means of hermetically sealed organic crystals. Housings are so designed that interaction with atmospheric components is avoided, and so that mechanical coupling is permitted, usually by means of rubber or other yieldable housing sections. In most uses, however, it has been necessary to continue using quartz despite its inefficient energy conversion.

In accordance with this invention, it has been discovered that cadmium sulfide combines many of the best piezoelectric attributes of the two classes of prior art materials. This material does not react with normal atmospheric components, does not dissolve in water, and is otherwise of known chemical and physical stability. Its maximum electromechanical coupling constant exceeds 0.2 and compares quite favorably with the maximum coefficient of 0.095 for X-cut quartz. Except for its photosensitivity, other properties of significance in piezoelectric devices are generally favorable and are described herein.

Cadmium sulfide, a II–VI semiconductor material of n-type conductivity as made by any of the conventionally reported growth methods (i.e., from the vapor phase or from the melt) has received considerable attention in the past by reason of its photoconductive sensitivity. Although always of n-type conductivity, the resistivity of the material varies over a wide range as grown, values being reported for from of the order of 1 ohm-cm. to of the order of $10^{12}$ ohm-cm. or greater—all of these values in the dark. As is indicated herein, use of this material in a piezoelectric element places a minimum tolerable value on its resistivity. As indicated, for some purposes it is considered that this minimum is of the order of $10^8$ ohm$^{-1}$ cm.$^{-1}$.

Although materials falling within this desired resistivity range are easily obtainable, some inquiry has been made into the possibility of compensating for lower resistivity n-type materials. Reported compensation methods make use, for example, of heating in sulfur vapor at high temperature and diffusing in copper, for example, from a surface coating.

Workers in the art are aware of a large class of devices for which cadmium sulfide by reason of its enumerated characteristics, is suitable. In a discussion of such device uses, reference is had to the drawing, in which.

*Determination of Electrical Characteristics*

Figure 1:
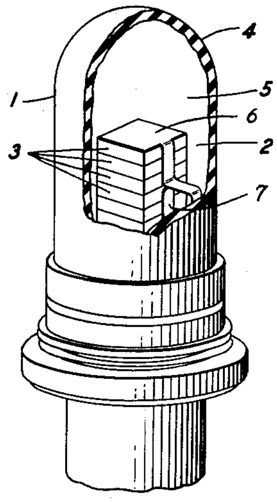
FIG. 1 is a perspective view, partly in section, of a hydrophone utilizing a stacked cadmium sulfide crystal array as the active element.

Two types of measurements were then made on the crystal. In the first of these, the specimen was supported by two parallel, horizontal nylon fibers and was capacitively coupled to an apparatus additionally consisting of a radio frequency signal generator and an oscilloscope. Capacitive coupling was accomplished by means of two shielded electrodes. These electrodes were made up of standard coaxial male connectors, the conductor at each terminus being shielded by use of a washer soldered to the outer conductor. The inner conductor of one such connector was attached to the generator, the other to the oscilloscope, and the outer conductors were grounded, as were the second leads from the generator and scope.

During this measurement, the output frequency of the generator was gradually increased over a range of 100 kilocycles to 10 megacycles per second, and corresponding outputs were observed on the scope. Below resonance, the crystal acted as a simple dielectric material, and no variation was noted in output. For this crystal, peaks were observed at frequencies of 466 kilocycles and integral multiples of this frequency. The first of these represented the fundamental length resonance in this cadmium sulfide rod. Based on $$v=2fL \qquad (1)$$

in which $v$=velocity in centimeters per second
$f$=frequency in cycles per second
$L$=length of crystal in centimeters, the velocity of sound was calculated to be $3.9\times10^5$ centimeters per second.

The piezoelectric coupling coefficient was calculated from these measurements by the resonance-antiresonance method. See W. P. Mason, "Piezoelectric Crystals and Their Application to Ultrasonics," chapter 5, D. Van Nostrand Company, Incorporated (1950). The actual method used was that outlined for a preferred configuration in which the effect of fringing fields was minimized. Since there was, in fact, an appreciable fringing field, the value so obtained was conservative. This measurement was of value chiefly in determining that the crystals would resonate, that is, that they were piezoelectric, and as a basis for determining the velocity of sound in this material. An actual coupling coefficient was more accurately determined on the basis of a direct measurement made of the piezoelectric constants, $d_{33}$.

*Direct Measurement of Piezoelectric Constant*

The crystal to be measured was placed in an apparatus between, and electrically connected with, an adjustable lower electrode and a movable upper electrode. The upper electrode was affixed to the end of a phosphor bronze leaf spring and was electrically grounded. The lower electrode was adjusted so that the crystal contacted the upper electrode. The remainder of the apparatus included a means for applying a calculable force to the upper end of the crystal, an air capacitor of known capacitance used to minimize decay time, and a vibrating reed electrometer (Carey model 31A) used to measure generated voltage. One terminal of each of these three elements was grounded. The other terminals were electrically connected so that the crystal, air capacitor and electrometer were electrically in parallel. The effect of applying a force to the crystal was to change the charge on the capacitor due to the piezoelectric effect, which could be determined by the change of voltage measured by the electrometer.

Two precautions were taken to avoid apparatus-introduced errors. Three different weights were applied and readings taken to balance out errors due to spring tensions. Piezoelectric constants determined on the basis of each of the measured fields so developed showed a maximum error of five percent. To serve as a basis for the determination of stray capacitances introduced into the circuit, the value of the air capacitor was varied over a range of from 200–1600 micromicrofarads. It was determined that errors due to such stray capacitances were within experimental error and could be ignored. On the basis of this measurement, the piezoelectric constant $d_{33}$ was determined to be equal to $3.2\times10^{-7}$ stat coulombs/dyne.

The entire hexagonal Wurtzite system is defined by three tensor components. In addition to $d_{33}$, these are $d_{31}$ and $d_{15}$. For this system the $d_{33}$ component is greater than either of the others. Due to this, many device uses will be so designed as to take advantage of the coefficient measured in this direction. For certain other purposes, however, as for example where shear mode is desirable or where resort is had to complex crystal cuts designed to compensate for temperature variation of the piezoelectric coefficient, use may be had of either of the other components. Based on studies made in this and other systems, it may be estimated that the relationships of $d_{31}$ and $d_{15}$ to $d_{33}$ are of the order of $-.4\times d_{33}$ and $-.8\times d_{33}$, respectively, so indicating approximate values for $d_{32}$ and $d_{15}$ of $-1.3\times10^{-7}$ stat coulombs/dyne and $-2.6\times10^{-7}$ stat coulombs/dyne.

Determination of the value of the coupling coefficient $k$ required knowledge of certain other characteristics. These characteristics were found to favor a high $k$. Accordingly, use is made of the elastic constants of cadmium sulfide as reported by D.I. Bolef, N. T. Melamed and M. Menes, Bulletin of the American Physical Society, series II, volume 5, page 169.

Following the teaching of Mason ("Electromechanical Transducers and Wave Filters," second edition (Van Nostrand 1948) section 6.32; and "Piezoelectric Crystals and Their Applications to Ultrasonics" (Van Nostrand 1950), page 452) the electromechanical coupling coefficient for a plate of cadmium sulfide with the hexagonal axis perpendicular to the large area of the plate vibrating in a thickness mode may be written as:

$$k=(d_{33}C^{E}_{33}+2d_{31}C^{E}_{31})\sqrt{\frac{4\pi}{\epsilon^{S}_{3}C^{D}_{33}}} \qquad (2)$$

where the symbols are those defined by Mason in "Piezoelectric Crystals."

Based on the measurements cited above and on the reasonable assumptions that $$C^{E}_{33}\cong C^{D}_{33}$$

and on the reported value for $$\epsilon(\epsilon^{S}_{3})$$

of 9, the coupling coefficient $k$ is computed to be equal to about 0.2.

The physical and chemical characteristics of cadmium sulfide are known. In general, this material does not react with ordinary atmospheric components and can withstand temperatures up to about 900° C. The characteristics set forth above indicate the suitability of piezoelectric zinc oxide in a variety of devices. Although a detailed description of such device uses is not considered within the proper scope of this disclosure, for convenience three device elements are schematically represented in the accompanying figures. All three devices are of standard design and are described elsewhere. See "Piezotronic Technical Data," published by Brush Electronics Company (1953), page 5 (FIG. 1) and page 8 (FIG. 2).

Referring again to FIG. 1, the device depicted is a typical hydrophone 1 employing a stack 2 of thin parallel-connected cadmium sulfide plates 3. The purpose of the stacked configuration, parallel-connected by means of inter-leaved foil electrodes not shown, is to obtain higher capacitance or lower impedance, unobtainable with a single thick crystalline block of given dimensions. Cover 4 of housing 1 is made of rubber or other flexible material so arranged as to yield under the influence of applied hydrostatic pressure. Coupling with crystal stack 2 is made through an oil or other fluid medium 5 which fills the entire interstitial volume between stack 2 and cover 4. All of plates 3 are oriented in the same manner, with the C-axis or 3 direction normal to their large faces shown disposed horizontally. Electrode contact is made via electrodes 6 and 7, which, as seen, are so arranged as to read off or produce a field also in the C direction. The device depicted therefore makes use of the $d_{33}$ piezoelectric constant.

The hydrophone of FIG. 1 is, of course, suitable for use as a transmitter as well as a receiver. As a transmitter, field is produced across the crystal stack by means of electrodes 6 and 7, and the physical vibration so produced is transferred through oil medium 5 and rubber cover 4 into the surrounding medium.

Figure 2:
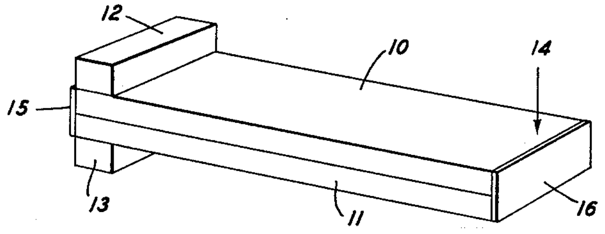
FIG. 2 is a perspective view of a cantilever mounted bender "bimorph" element also utilizing the piezoelectric material of this invention.

In FIG. 2 there is shown a cantilever mounted bender "bimorph" such as may find use in a crystal pick-up phonograph arm. The element shown consists of cadmium sulfide plates 10 and 11, both arranged with their C-axis corresponding with their length dimension but oriented in opposite directions so that compression on element 10 and tension on element 11 results in an electrical field of a given direction. Plates 10 and 11 are shown rigidly clamped between soft rubber or plastic pads 12 and 13. Application of force at point 14, which may result from the back and forth movement of a stylus produced by undulations in the grooves of a rotating phonograph record, produces an A.-C. voltage developed between electrodes 15 and 16. Leads, not shown, attached to the said electrodes 15 and 16 in turn serve as input leads to an audio amplifier, also not shown.

Figure 3:
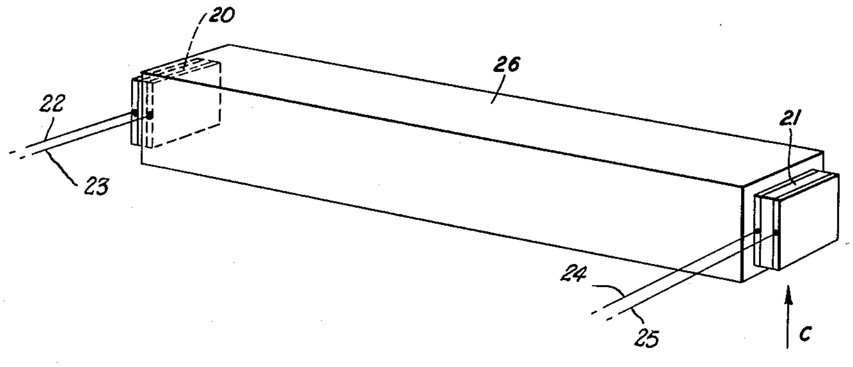
FIG. 3 is a perspective view of an ultrasonic delay line utilizing elements of the inventive material.

The device of FIG. 3 is an ultrasonic delay line. The device consists of cadmium sulfide elements 20 and 21. Each of the elements 20 and 21 has electrodes deposited or otherwise affixed to flat surfaces, the said electrodes in turn being electrically connected with wire leads 22 and 23 for element 20 and 24 and 25 for element 21. Elements 20 and 21 are cemented to vitreous silica delay element 26 which serves to transmit physical vibrations from one of the piezoelectric elements to the other. In operation, a signal impressed across, for example, leads 22 and 23 of element 20 results in a field produced across that element, so producing vibration in the crystal. This vibration, of a frequency corresponding with the signal, is transmitted through delay element 26 and finally results in a similar vibration being produced in piezoelectric element 21. The resulting signal produced across wire leads 24 and 25 is of the same frequency as that introduced across leads 22 and 23. A typical device of this class may have a length of the order of five inches and a square cross section of the order of three-quarters of an inch on a side.

Tolerable conductivity values may be calculated on the basis of tolerable Q values in accordance with the relationship:

$$Q=R\omega C_1 \quad (3)$$

where

Q is a "quality factor."
R is the resistance of the crystal.
$\omega/2\pi=f$ is the frequency of operation.
$C_1$ is the motional capacitance of the crystal which may be written in terms of the electrical capacitance and the electromechanical coupling constant as $$C_1=C_0\frac{8}{\pi 2}\sqrt{\frac{k^2}{1-k^2}}$$

If we choose $k=.45$ and the dielectric constant as 8.2

$$Q=\frac{4.5\times 10^{-12}f}{\sigma}$$

where $\sigma$ is the conductivity in $\text{ohm}^{-1}$ $\text{cm.}^{-1}$.

On the basis of this relationship, it may be calculated that a tolerable Q value of 100 corresponds in turn with a room temperature conductivity of the order of $10^{-8}$ $\text{ohm}^{-1}$ $\text{cm.}^{-1}$ for an operating frequency of 200 kilocycles. It is considered that, in general, most device uses require a minimum value of this order, so that for the purposes of this disclosure a room temperature conductivity value of $10^{-8}$ $\text{ohm}^{-1}$ $\text{cm.}^{-1}$ is considered necessary. For many devices, Q values of a larger magnitude are desired, this in turn indicating a preferred minimum room temperature conductivity of the order of $10^{-11}$ $\text{ohm}^{-1}$ $\text{cm.}^{-1}$. This conductivity value is, therefore, considered to be a preferred lower limit for the purposes of this disclosure.

It is well known that cadmium sulfide shows a marked photoconductive effect. It has been shown that a minimum tolerable resistivity value exists below which the piezoelectric effect is significantly damped. Since the photoconductive effect results in a marked decrease in resistivity in the presence of light, it is clear that a piezoelectric device utilizing cadmium sulfide must be sufficiently shielded to avoid exceeding the minimum tolerable conductivity value. Also, where variation in amplitude of the output signal is to be avoided, it is necessary to shield the element to avoid variation in resistivity even where the minimum produced through the photoconductive mechanism is above the tolerable limit.

The invention has been described in terms of a limited number of exemplary embodiments. It is evident from the material characteristics set forth that these embodiments in no way form an exhaustive listing. In general, the piezoelectric material of this invention is considered suitable for all piezoelectric devices known, as well as for others which may be developed, providing these device configurations make use of at least one factor of any one of the piezoelectric tensor components unequal to zero, i.e., $d_{33}$, $d_{31}$, $d_{32}$, $d_{15}$ and $d_{24}$. As is well known, crystal cuts may beneficially make use of one or more of such tensor components in combination, as, for example, for the purpose of decreasing the piezoelectric temperature coefficient.

What is claimed is:

1. A piezoelectric device comprising at least one element consisting essentially of a single crystal of cadmium sulfide of a maximum room temperature conductivity of $10^{-8}$ $\text{ohm}^{-1}$ $\text{cm.}^{-1}$ and means for making electrode contact with the said element on two faces.

2. The device of claim 1 in which the smallest dimension of the said element corresponds with the crystallographic C-axis and in which electrode contact is made to two faces perpendicular to the C-axis.

3. A piezoelectric device including at least one element consisting essentially of a single crystal of cadmium sulfide together with electrode contact to two faces of the said element, the crystallographic orientation and cut of the said element being such that operation of the device makes use of extensional strain.

References Cited in the file of this patent

UNITED STATES PATENTS

| | | |
|---|---|---|
| 2,277,008 | Ardenne | Mar. 17, 1942 |
| 2,410,825 | Lane | Nov. 12, 1946 |
| 2,434,648 | Goodale et al. | Jan. 20, 1948 |
| 2,584,324 | Bousky | Feb. 5, 1952 |
| 2,596,460 | Arenberg | May 13, 1952 |
| 2,614,144 | Howatt | Oct. 14, 1952 |